(12) United States Patent
Lee

(10) Patent No.: US 7,224,194 B2
(45) Date of Patent: May 29, 2007

(54) OUTPUT DRIVER CIRCUIT

(75) Inventor: Dong-uk Lee, Gyunggi-Do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 183 days.

(21) Appl. No.: 10/982,032

(22) Filed: Nov. 4, 2004

(65) Prior Publication Data

US 2005/0225363 A1 Oct. 13, 2005

(30) Foreign Application Priority Data

Apr. 12, 2004 (KR) ............ 10-2004-0025059

(51) Int. Cl.
*H03B 1/00* (2006.01)
(52) U.S. Cl. ............ 327/112; 327/382; 327/108
(58) Field of Classification Search ........ 327/112, 327/382
See application file for complete search history.

(56) References Cited

U.S. PATENT DOCUMENTS

| 6,262,617 | B1 | 7/2001 | McClure ............ 327/170 |
| 6,586,974 | B1* | 7/2003 | Humphrey et al. ...... 327/112 |
| 6,683,482 | B2* | 1/2004 | Humphrey et al. ...... 327/112 |
| 2003/0025541 | A1* | 2/2003 | Humphrey et al. ...... 327/170 |
| 2004/0076039 | A1 | 4/2004 | Chung et al. ...... 365/189.05 |

* cited by examiner

*Primary Examiner*—Long Nguyen
(74) *Attorney, Agent, or Firm*—Marshall, Gerstein & Borun LLP (57) ABSTRACT

The present invention relates to an output driver circuit which exhibits a reduced variation in the slew rate of an output signal thereof, irrespective of a variation in temperature occurring during a process carried out by a semiconductor memory device, to which the output driver circuit is applied, or a variation in temperature caused by the operation characteristics of the semiconductor memory device, while exhibiting excellent operation characteristics even in a high-speed operation mode thereof.

13 Claims, 5 Drawing Sheets

FIG.1

(PRIOR ART)

OUTPUT DRIVER CIRCUIT

This application relies for priority upon Korean Patent Application No. 2004-0025059 filed on Apr. 12, 2004, the contents of which are herein incorporated by reference in their entirety.

BACKGROUND OF THE INVENTION

1. Field of the Invention

The present invention relates to an output driver circuit, and more particularly to an output driver circuit which is capable of preventing an abrupt variation in the slew rate thereof when a variation in resistance and supply voltage occurs due to a variation in process and temperature conditions, so that it is widely usable on output stages of high-speed interface circuits.

2. Description of the Related Art

Semiconductor devices use an output driver circuit to output internal data from a chip thereof to the outside of the chip through an output terminal, that is, an output pad.

Such an output driver circuit includes a push-pull driver. One important function of such a push-pull driver is to control the slew rate of an output signal.

"Slew rate" means a variation rate of the voltage level of an output signal, so that it may be considered as a gradient of voltage to time. Such a slew rate may be a rising slew rate or a falling slew rate. The rising slew rate represents the gradient of an output voltage, the level of which is transited from a low level to a high level. On the other hand, the falling slew rate represents the gradient of an output voltage, the level of which is transited from a high level to a low level. At a higher slew rate, the gradient of the output voltage is sharper. In other words, the level of the output voltage is abruptly varied within a short time. Where an output push-pull driver exhibits a high slew rate, large noise current is generated. For this reason, such an output push-pull driver is unsuitable for the output stage of a high-speed interface circuit.

Figure 1:
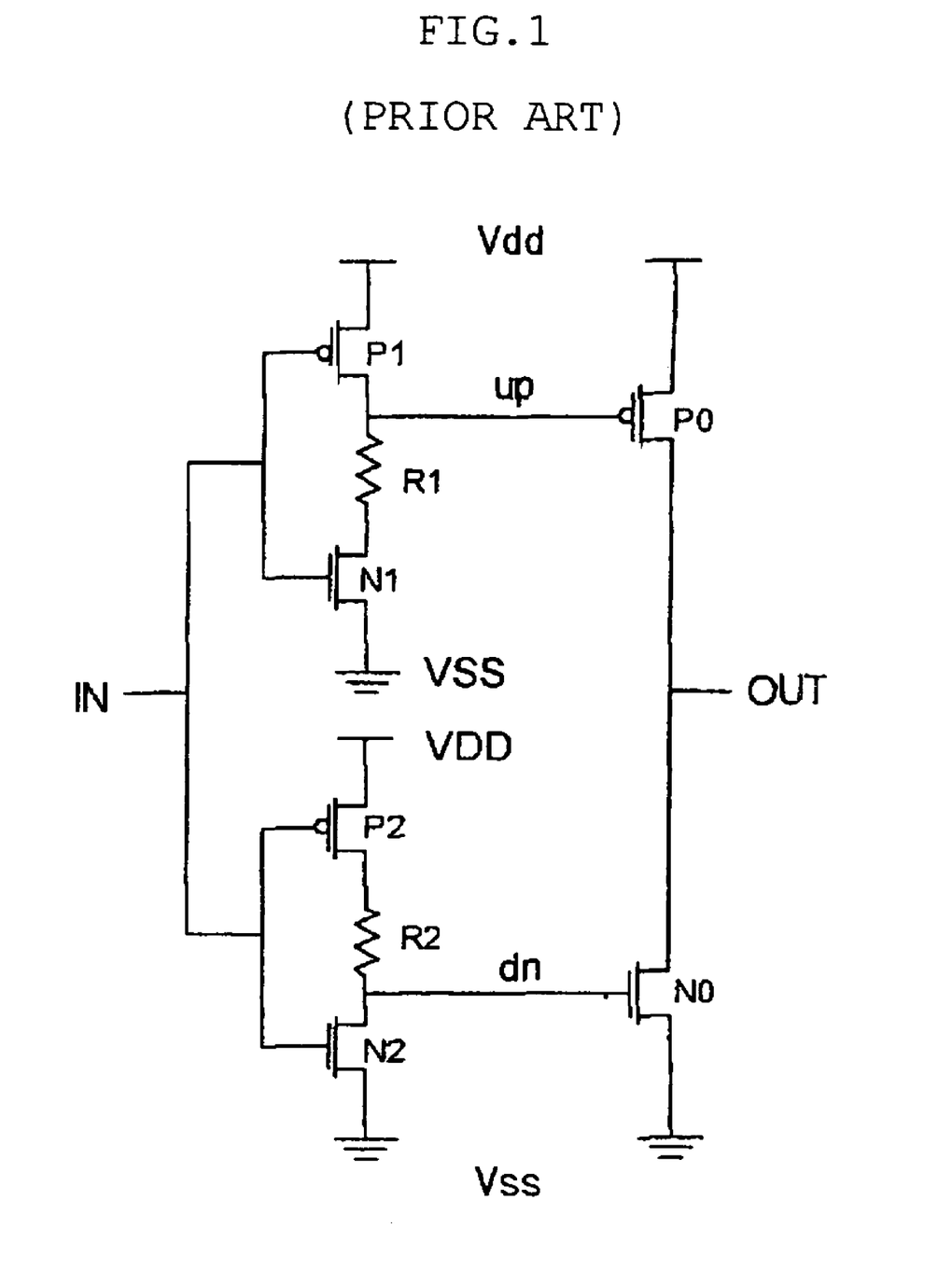
FIG. 1 is a circuit diagram illustrating a configuration of a conventional output driver circuit.

FIG. 1 illustrates a configuration of a conventional output driver circuit. Operation of the conventional driver circuit and problems involved therewith will be described with reference to FIG. 1.

FIG. 1 shows an example in which the conventional output driver circuit is applied to a DRAM. As shown in FIG. 1, the output driver circuit includes a pre-driver including a CMOS transistor composed of a PMOS transistor P1 and an NMOS transistor N1, and adapted to perform a switching operation in response to an input data signal IN, and another CMOS transistor composed of a PMOS transistor P2 and an NMOS transistor N2, and adapted to perform a switching operation in response to the input data signal IN. The output driver circuit also includes a PMOS transistor P0 serving as a pull-up element adapted to perform a switching operation in response to a signal at an output node up between the PMOS transistor P1 and the NMOS transistor N1, and an NMOS transistor N0 serving as a pull-down element adapted to perform a switching operation in response to a signal at an output node dn between the PMOS transistor P2 and the NMOS transistor N2.

The conventional output driver circuit further includes a means for controlling the slew rate of an output signal thereof. In the illustrated case, the slew rate control means comprises resistors R1 and R2 included in the pre-driver. In accordance with this configuration, when the input data signal IN has a high level, both the PMOS transistors P1 and P2 are turned off, whereas both the NMOS transistors N1 and N2 are turned on. In this state, discharging of current is carried out. As a result, the potential at the output node up, that is, voltage Vup, is lowered to a level Vss in accordance with a time constant t1 (t1=(R1+R_N1)×C_up). Here, "C_up" represents a parasitic capacitance generated at the output nod up, and "R_N1" represents an on-resistance of the NMOS transistor N1 in an ON state thereof. That is, the voltage Vup is lowered, as expressed by the following Expression:

$$V{\rm up}=Vdd \times e-t/t1 \qquad \text{[Expression 1]}$$

In accordance with Expression 1 associated with discharging of current, the PMOS transistor P0, which is a driving element, drives the voltage at an output terminal of the output driver circuit to a level Vdd. Thus, the resultant output signal has a certain slew rate.

Similarly, when the input data signal IN has a low level, both the NMOS transistors N1 and N2 are turned off, whereas both the PMOS transistors P1 and P2 are turned on. In this state, discharging of current is carried out. As a result, the potential at the output node dn, that is, voltage Vdn, is raised to the level Vdd in accordance with a time constant t2 (t2=(R2+R_P2)×C_dn). Here, "C_down" represents a parasitic capacitance generated at the output nod dn, and "R_P2" represents an on-resistance of the PMOS transistor P2 in an ON state thereof. That is, the voltage Vdn is raised, as expressed by the following Expression:

$$V{\rm dn}=Vdd \times (1-e^{-t/t2}) \qquad \text{[Expression 2]}$$

In accordance with the Expression associated with charging of current, the NMOS transistor N0, which is a driving element, drives the voltage at the output terminal of the output driver circuit to a level Vss. Thus, the resultant output signal has a certain slew rate.

However, the conventional output driver circuit has a problem in that the slew rate characteristics thereof are unstable. That is, the semiconductor memory device, to which the output driver circuit is applied, exhibits a high temperature variation during a process carried out thereby. In particular, the semiconductor memory device exhibits an increase in temperature during a high-speed operation thereof. In this case, the resistors included in the output driver circuit exhibit a variation in resistance because they are sensitive to a variation in temperature. For this reason, a variation in temperature causes each resistor to exhibit a variation in resistance, thereby varying the time constants t1 and t2, which are expressed in Expressions 1 and 2. As a result, respective voltages at the nodes up and dn vary. Thus; the conventional output driver circuit exhibits an abrupt variation in slew rate in accordance with a temperature variation occurring in the associated semiconductor memory device. Such a slew rate variation adversely affects the signal characteristics of the semiconductor memory device.

SUMMARY OF THE INVENTION

Therefore, an object of the invention is to provide an output driver circuit which exhibits a reduced variation in the slew rate of an output signal thereof, irrespective of a variation in temperature occurring during a process carried out by a semiconductor memory device, to which the output driver circuit is applied, or a variation in temperature caused by the operation characteristics of the semiconductor memory device, while exhibiting excellent operation characteristics even in a high-speed operation mode thereof.

In accordance with one aspect, the present invention provides an output driver circuit comprising: a pull-up driver adapted to output a supply voltage to an output terminal; a pull-down driver adapted to output a ground voltage to the output terminal; a first pull-up pre-driver adapted to be enabled in response to a data input signal, and to pull up, in an enable state thereof, a gate of the pull-up driver to a level of the supply voltage, using a first charge current controlled by a first current supplied from a current supply unit; a first pull-down pre-driver adapted to be enabled in response to the data input signal, and to pull down, in an enable state thereof, the gate of the pull-up driver to a level of the ground voltage, using a first discharge current controlled by a second current supplied from the current supply unit; a second pull-up pre-driver adapted to be enabled in response to the data input signal, and to pull up, in an enable state thereof, a gate of the pull-down driver to the level of the supply voltage, using a second charge current controlled by the first current; and a second pull-down pre-driver adapted to be enabled in response to the data input signal, and to pull down, in an enable state thereof, the gate of the pull-down driver to the level of the ground voltage, using a second discharge current controlled by the second current.

The first pull-up pre driver may comprise a first transistor adapted to allow the first current to flow between a supply voltage source and the current supply unit, and a second transistor adapted to compose a current mirror, together with the first transistor; to pull up the gate of the pull-up driver, using the first charge current, which has a predetermined magnitude proportional to the first current.

The first pull-down pre-driver may comprise a first transistor adapted to allow the second current to flow between the current supply unit and a ground, and a second transistor adapted to compose a current mirror, together with the first transistor, to pull down the gate of the pull-up driver, using the first discharge current, which has a predetermined magnitude proportional to the second current.

Where the first pull-up pre-driver comprises a first transistor adapted to allow the first current to flow between a supply voltage source and the current supply unit, and a second transistor adapted to compose a current mirror, together with the first transistor, to pull up the gate of the pull-up driver, using the first charge current, which has a predetermined magnitude proportional to the first current, the first pull-down pre-driver comprises a third transistor adapted to allow the second current to flow between the current supply unit and a ground, and a fourth transistor adapted to compose a current mirror, together with the third transistor, to pull down the gate of the pull-up driver, using the first discharge current, which has a predetermined magnitude proportional to the second current.

The second pull-up pre-driver may comprise a first transistor adapted to allow the first current to flow between a supply voltage source and the current supply unit, and a second transistor adapted to compose a current mirror, together with the first transistor, to pull up the gate of the pull-down driver, using the second charge current, which has a predetermined magnitude proportional to the first current.

The second pull-down pre-driver may comprise a first transistor adapted to allow the second current to flow between the current supply unit and a ground, and a second transistor adapted to compose a current mirror, together with the first transistor, to pull down the gate of the pull-down driver, using the second discharge current, which has a predetermined magnitude proportional to the second current.

Where the second pull-up pre-driver comprises a first transistor adapted to allow the first current to flow between a supply voltage source and the current supply unit, and a second transistor adapted to compose a current mirror, together with the first transistor, to pull up the gate of the pull-down driver, using the second charge current, which has a predetermined magnitude proportional to the first current, the second pull-down pre-driver may comprise a third transistor adapted to allow the second current to flow between the current supply unit and a ground, and a fourth transistor adapted to compose a current mirror, together with the third transistor, to pull down the gate of the pull-down driver, using the second discharge current, which has a predetermined magnitude proportional to the second current.

Where the first pull-up pre-driver comprises a first transistor adapted to allow the first current to flow between a supply voltage source and the current supply unit, and a second transistor adapted to compose a current mirror, together with the first transistor, to pull up the gate of the pull-up driver, using the first charge current, which has a predetermined magnitude proportional to the first current, and the first pull-down pre-driver comprises a third transistor adapted to allow the second current to flow between the current supply unit and a ground, and a fourth transistor adapted to compose a current mirror, together with the third transistor, to pull down the gate of the pull-up driver, using the first discharge current, which has a predetermined magnitude proportional to the second current, the second pull-up pre-driver may comprise a fifth transistor adapted to allow the first current to flow between the supply voltage source and the current supply unit, and a sixth transistor adapted to compose a current mirror, together with the fifth transistor, to pull up the gate of the pull-down driver, using the second charge current, which has a predetermined magnitude proportional to the first current. In this case, the second pull-down pre-driver may also comprise a seventh transistor adapted to allow the second current to flow between the current supply unit and the ground, and an eighth transistor adapted to compose a current mirror, together with the seventh transistor, to pull down the gate of the pull-down driver, using the second discharge current, which has a predetermined magnitude proportional to the second current.

The output driver circuit may further comprise a compensation capacitor connected to the gate of the pull-down driver and the ground, and adapted to compensate for a parasitic capacitance difference between the gate of the pull-up driver and the gate of the pull-down driver.

The current supply unit may comprise a plurality of current-dividing transistors adapted to divide, into current of a predetermined magnitude, current flowing between a first node, which is maintained at a level corresponding to a reference voltage, and the ground, and then to supply the divided current to the first node, a ninth transistor adapted to allow a third current to flow therethrough in a magnitude corresponding to that of the divided current in response to a voltage at respective gates of the current-dividing transistors, a tenth transistor adapted to compose a current mirror, together with the ninth transistor, to output, as the second current, a current having a predetermined magnitude proportional to the third current, an eleventh transistor adapted to supply the third current from the ninth transistor to the ground, and a twelfth transistor adapted to compose a current mirror, together with the eleventh transistor, to output, as the first current, a current having a predetermined magnitude proportional to the third current.

In accordance with another aspect, the present invention provides an output driver circuit comprising: a pull-up driver adapted to output a supply voltage to an output terminal; a pull-down driver adapted to output a ground voltage to the output terminal; a first pre-driver including a first pull-up unit adapted to pull up a gate of the pull-up, driver to a level of the supply voltage in response to a first voltage having a predetermined level, and a first pull-down unit adapted to pull down the gate of the pull-up driver to a level of the ground voltage in response to a second voltage having a predetermined level; and a second pre-driver including a second pull-up unit adapted to pull up a gate of the pull-down driver to the level of the supply voltage in response to the first voltage, and a second pull-down unit adapted to pull down the gate of the pull-down driver to the level of the ground voltage in response to the second voltage.

The first pre-driver may further include first and second switching units adapted to switch respective operations of the first pull-up unit and first pull-down unit in response to a predetermined data input signal.

The second pre-driver may further include first and second switching units adapted to switch respective operations of the second pull-up unit and second pull-down unit in response to a predetermined data input signal.

The output driver circuit may further comprise a compensation capacitor connected to the gate of the pull-down driver and a ground, and adapted to compensate for a parasitic capacitance difference between the gate of the pull-up driver and the gate of the pull-down driver.

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENTS

Figure 2:
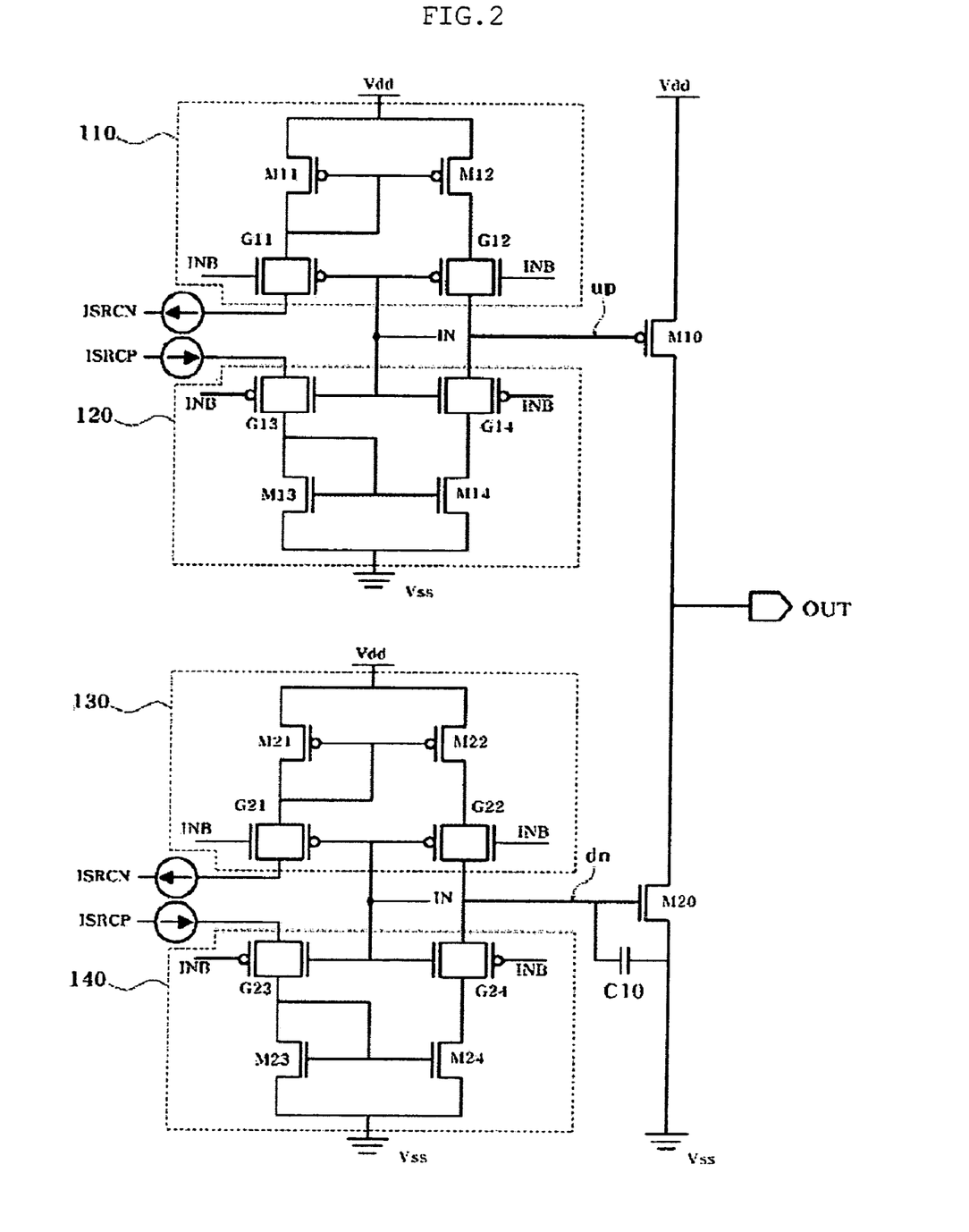
FIG. 2 is a circuit diagram illustrating an output driver circuit according to a first embodiment of the present invention.

FIG. 2 is a circuit diagram illustrating an output driver circuit according to a first embodiment of the present invention.

As shown in FIG. 2, the output driver circuit includes a PMOS transistor M10 as a pull-up driver adapted to output a supply voltage Vdd to an output terminal OUT, and an NMOS transistor M20 as a pull-down driver adapted to output a ground voltage Vss to the output terminal OUT. The output driver circuit also includes a first pull-up pre-driver 110 adapted to be enabled in response to a data input signal IN, and to pull up, in an enable state thereof, a gate up of the PMOS transistor M10 to the level of the supply voltage Vdd in accordance with a first charge current flowing therethrough under the control of a current ISRCN supplied from a current supply unit, and a first pull-down pre-driver 120 adapted to be enabled in response to the data input signal IN, and to pull down, in an enable state thereof, the gate up of the PMOS transistor M10 to the level of the ground voltage Vss in accordance with a first discharge current flowing therethrough under the control of a current ISRCP supplied from the current supply unit. The output driver circuit further includes a second pull-up pre-driver 130 adapted to be enabled in response to the data input signal IN, and to pull up, in an enable state thereof, a gate dn of the NMOS transistor M20 to the level of the supply voltage Vdd in accordance with a second charge current flowing therethrough under the control of the current ISRCN, and a second pull-down pre-driver 140 adapted to be enabled in response to the data input signal IN, and to pull down, in an enable state thereof, the gate dn of the NMOS transistor M20 to the level of the ground voltage Vss in accordance with a second discharge current flowing therethrough under the control of the current ISRCP.

Operation of the output driver circuit according to the first embodiment of the present invention will now be described in detail with reference to FIG. 2.

In accordance with a transition of the input data signal IN from a low level to a high level, an inverse signal INB to the input data signal IN is transited from a high level to a low level. In this state, switches G11 and G12, which are coupled to the inverse signal INB, are turned off. On the other hand, switches G13 and G14, which are also coupled to the inverse signal INB, are turned on. Accordingly, PMOS transistors M11 and M12, which are connected to respective switches G11 and G12 while composing a current mirror of the first pull-up pre-driver 110, are floated, so that they are inactive. On the other hand, NMOS transistors M13 and M14, which are connected to respective switches G13 and G14 while composing a current mirror of the first pull-down pre-driver 120, are turned on. As a result, the current ISRCP supplied from the current supply unit flows to the ground Vss through the NMOS transistor M13. Meanwhile, current of a predetermined magnitude corresponding to that of the current ISRCP flows through the NMOS transistor M14, which shares a gate thereof with the NMOS transistor M13 to compose the current mirror of the first pull-down pre-driver 120. Accordingly, charges stored in the gate up of the PMOS transistor M10 are discharged, thereby causing the PMOS transistor M10 to turn on. In this case, the magnitude of discharge current is determined in accordance with a size ratio between the NMOS transistors M13 and M14. Therefore, where the NMOS transistor M14 has a size corresponding to, for example, N times the size of the NMOS transistor M13, the discharge current magnitude corresponds to "N×ISRCP". The time taken for the gate up of the PMOS transistor M10 to be completely discharged in this case is determined in accordance with the magnitude of the current ISRCP, the parasitic capacitance generated at the gate up of the PMOS transistor M10, and the charged voltage at the gate up of the PMOS transistor M10. Also, the time taken for the PMOS transistor M10 to turn on is determined in accordance with a variation in potential at the gate up of the PMOS transistor M10 depending on the discharge current magnitude. For example, where the NMOS transistor M14 has a size corresponding to N times the size of the NMOS transistor M13, the potential at the gate up of the PMOS transistor M10 can be expressed as follows:

$$V_{up} = V_{dd} - (I\_M14/C\_up) \times t$$

$$I\_M14 = N \times ISRCP \quad \text{[Expression 3]}$$

("Vup" represents a voltage at the gate up, "I_M14" represents the magnitude of current flowing through the NMOS transistor M14, and "C_up" represents a parasitic capacitance at the gate up. Where "Vup" approximates to zero, the operating region of the NMOS transistor M14 is changed from a saturation region to a triode region because the source-drain voltage of the NMOS transistor M14 approximates to zero, so that the current I_M14 approximates to zero.)

On the other hand, when the input data signal IN is transited from a low level to a high level, the second pull-up pre-driver 130 and second pull-down pre-driver 140 operate as follows. That is, switches G21 and G22, which are coupled to the inverse signal INB, are turned off. On the other hand, switches G23 and G24, which are also coupled to the inverse signal INB, are turned on. Accordingly, PMOS transistors M21 and M22, which are connected to respective switches G21 and G22 while composing a current mirror of the second pull-up pre-driver 130, are inactive. On the other hand, NMOS transistors M23 and M24, which are connected to respective switches G23 and G24 while composing a current mirror of the second pull-down pre-driver 140, are turned on. As a result, the current ISRCP supplied from the current supply unit flows to the ground Vss through the NMOS transistor M23. Meanwhile, current of a predetermined magnitude corresponding to that of the current ISRCP flows through the NMOS transistor M24. Accordingly, charges stored in the gate dn of the NMOS transistor M20 are discharged, thereby causing the NMOS transistor M20 to turn off. In this case, the magnitude of discharge current is determined in accordance with a size ratio between the NMOS transistors M23 and M24. Therefore, where the NMOS transistor M24 has a size corresponding to, for example, M times the size of the NMOS transistor M23, the discharge current magnitude corresponds to "M×ISRCP". The time taken for the gate dn of the NMOS transistor M20 to be completely discharged in this case is determined in accordance with the magnitude of the current ISRCP, the parasitic capacitance generated at the gate dn of the NMOS transistor M20, and the charged voltage at the gate dn of the NMOS transistor M20. Also, the time taken for the NMOS transistor M20 to turn off is determined in accordance with a variation in potential at the gate dn of the NMOS transistor M20 depending on the discharge current magnitude. For example, where the NMOS transistor M24 has a size corresponding to N times the size of the NMOS transistor M23, the potential at the gate dn of the NMOS transistor M20 can be expressed as follows:

$$V_{dn} = V_{dd} - (I\_M24/C\_dn) \times t$$

$$I\_M24 = M \times ISRCP \quad \text{[Expression 4]}$$

("Vdn" represents a voltage at the gate dn, "I_M24" represents the magnitude of current flowing through the NMOS transistor M24, and "C_dn" represents a parasitic capacitance at the gate dn. Where "Vdn" approximates to zero, the operating region of the NMOS transistor M24 is changed from a saturation region to a triode region because the source-drain voltage of the NMOS transistor M24 approximates to zero, so that the current I_M24 approximates to zero.)

Thus, the turning-on time of the PMOS transistor M10 and the turning-off time of the NMOS transistor M20 can be controlled by the current ISRCP, which has a predetermined magnitude. Accordingly, it is possible to stably control a slew rate according to rising of an output voltage, that is, a rising slew rate, determined in accordance with the turning-on time of the PMOS transistor M10 and the turning-off time of the NMOS transistor 20, using the current ISRCP.

When the input data signal IN is transited from a high level to a low level, the switches G11 and G12 are turned on, whereas the switches G13 and G14 are turned off. Accordingly, the PMOS transistors M11 and M12 turn on, whereas the NMOS transistors M13 and M14 turn off. As a result, the current ISRCN flows from the supply voltage source Vdd to the current supply unit via the PMOS transistor M11. Meanwhile, current of a predetermined magnitude corresponding to that of the current ISRCN flows through the PMOS transistor M12, which composes the current mirror of the first pull-down pre-driver 120, together with the PMOS transistor M11. Accordingly, the gate up of the PMOS transistor M10 is charged, thereby causing the PMOS transistor M10 to turn off. In this case, the magnitude of charge current is determined in accordance with a size ratio between the PMOS transistors M11 and M12. Therefore, where the PMOS transistor M12 has a size corresponding to, for example, N times the size of the PMOS transistor M11, the magnitude of charge current through the PMOS transistor M12 corresponds to "N×ISRCN". The time taken for the gate up of the PMOS transistor M10 to be completely charged in this case is determined in accordance with the magnitude of the current ISRCN, and the parasitic capacitance generated at the gate up of the PMOS transistor M10. Also, the time taken for the PMOS transistor M10 to turn off is determined in accordance with a variation in potential at the gate up of the PMOS transistor M10 depending on the charge current magnitude. For example, where the PMOS transistor M12 has a size corresponding to N times the size of the PMOS transistor M11, the potential at the gate up of the PMOS transistor M10 can be expressed as follows:

$$V_{up} = (I\_M12/C\_up) \times t$$

$$I\_M12 = N \times ISRCN \quad \text{[Expression 5]}$$

("I_M12" represents the magnitude of current flowing through the PMOS transistor M12. Where "Vup" approximates to "Vdd", the operating region of the PMOS transistor M12 is changed from a saturation region to a triode region because the source-drain voltage of the PMOS transistor M12 approximates to zero, so that the current I_M12 approximates to zero.)

On the other hand, when the input data signal IN is transited from a high level to a low level, the second pull-up pre-driver 130 and second pull-down pre-driver 140 operate as follows. That is, the switches G21 and G22 turn on, whereas the switches G23 and G24 turn off. Accordingly, the PMOS transistors M21 and M22 of the second pull-down pre-driver 140 turn on, whereas the NMOS transistors M23 and M24 turn off. As a result, the current ISRCN flows from the supply voltage source Vdd to the current supply unit through the PMOS transistor M21. Meanwhile, current of a predetermined magnitude corresponding to that of the current ISRCN flows through the PMOS transistor M22, which composes the current mirror of the second pull-up pre-driver 130, together with the PMOS transistor M21. Accordingly, the gate dn of the NMOS transistor M20 is discharged, thereby causing the NMOS transistor M20 to turn on. In this case, the magnitude of charge current is determined in accordance with a size ratio between the PMOS transistors M21 and M22. Therefore, where the PMOS transistor M22 has a size corresponding to, for example, M times the size of the PMOS transistor M21, the charge current magnitude corresponds to "M×ISRCN". The time taken for the gate dn of the NMOS transistor M20 to be completely charged in this case is determined in accordance with the magnitude of the current ISRCN, and the parasitic capacitance generated at the gate dn of the NMOS transistor M20. Also, the time taken for the NMOS transistor M20 to turn on is determined in accordance with a variation in potential at the gate dn of the NMOS transistor M20 depending on the charge current magnitude. For example, where the PMOS transistor M22 has a size corresponding to N times the size of the PMOS transistor M21, the potential at the gate dn of the NMOS transistor M20 can be expressed as follows:

$$Vdn=(I\_M22/C\_dn) \times t$$

$$I\_M22=M \times ISRCN \qquad \text{[Expression 6]}$$

("I_M22" represents the magnitude of current flowing through the PMOS transistor M22. Where "Vdn" approximates to "Vdd", the operating region of the PMOS transistor M22 is changed from a saturation region to a triode region because the source-drain voltage of the PMOS transistor M22 approximates to zero, so that the current I_M22 approximates to zero.)

Thus, the turning-off time of the PMOS transistor M10 and the turning-on time of the NMOS transistor M20 can be controlled by the current ISRCN, which has a predetermined magnitude. Accordingly, it is possible to stably control a slew rate according to falling of an output voltage, that is, a falling slew rate, determined in accordance with the turning-off time of the PMOS transistor M10 and the turning-on time of the NMOS transistor 20, using the current ISRCN.

As apparent from the above description, the output driver circuit according to the first embodiment of the present invention can effectively control the slew rate of an output voltage, using current of a predetermined magnitude supplied from the current supply unit. Accordingly, it is possible to obtain stable slew rate characteristics even under severe conditions of the semiconductor memory device such as a variation in temperature and high-speed operation.

Meanwhile, the output driver circuit should exhibit the same pull-up and pull-down abilities at the output stage thereof. To this end, the PMOS transistor M10, which is a pull-up driver, should have a size corresponding to about 2 times that of the NMOS transistor M20, which is a pull-down driver. In this case, however, the parasitic capacitance generated at the gate up of the pull-up driver, also corresponds to about 2 times the parasitic capacitance generated at the gate dn of the pull-down driver. Such a parasitic capacitance difference may cause different ON/OFF timings. In order to avoid such a phenomenon, the output driver circuit according to the first embodiment of the present invention may further include a compensation capacitor C10 connected between the gate dn of the NMOS transistor M20 and the ground Vss, as shown in FIG. 2.

Figure 3:
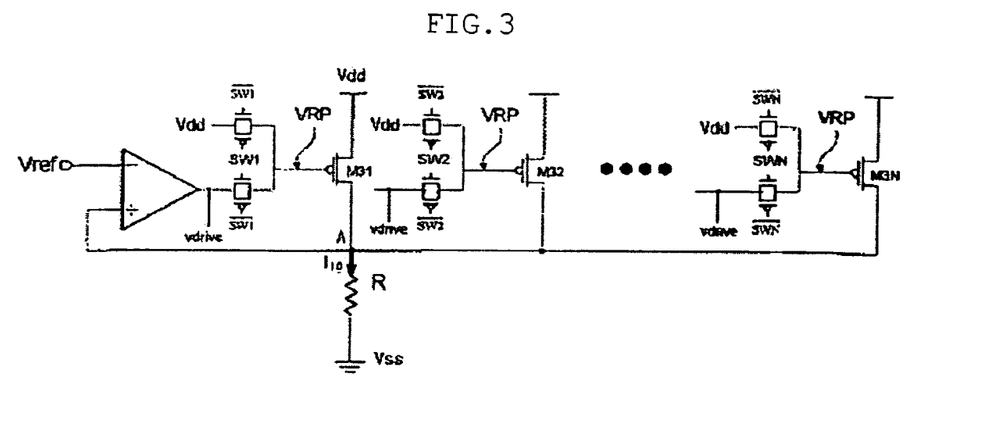
FIG. 3 is a circuit diagram illustrating a reference current generating circuit included in a current supply unit used in the output driver circuit according to the first embodiment of the present invention.
Figure 4:
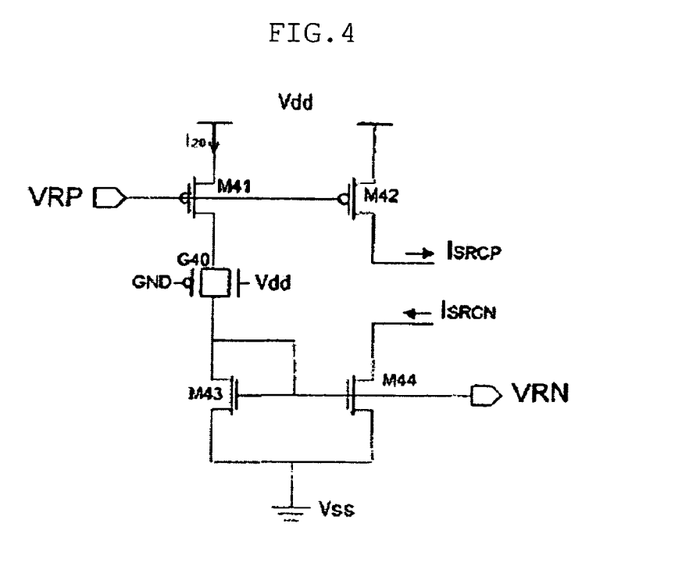
FIG. 4 is a circuit diagram illustrating a configuration of the current supply unit used in the output driver circuit according to the first embodiment of the present invention.

FIG. 3 illustrates a reference current generating circuit included in the current supply unit used in the output driver circuit according to the first embodiment of the present invention. FIG. 4 illustrates a configuration of the current supply unit used in the output driver circuit according to the first embodiment of the present invention. Now, the configuration and operation of the current supply unit, which supplies the current ISRCP and the current ISRCN in accordance with the first embodiment of the present invention, will be described with reference to FIGS. 3 and 4.

The current supply unit includes a plurality of current-dividing PMOS transistors M31, M32, ..., M3N adapted to divide, into current of a predetermined magnitude, current flowing between a node A, maintained at a level corresponding to a reference voltage Vref, and the ground Vss, and then to supply the divided current having the predetermined magnitude to the node A. The current supply unit also includes a PMOS transistor M41 adapted to allow a current I20 to flow therethrough in a magnitude corresponding to that of the divided current in response to a voltage VRP at respective gates of the PMOS transistors M31, M32 ..., M3N, a PMOS transistor M42 adapted to share a gate thereof with the PMOS transistor M41, and to output, as the current ISRCP, a mirror current having a predetermined magnitude proportional to the current I20, an NMOS transistor M43 adapted to supply the current I20 from the PMOS transistor M41 to the ground Vss, and an NMOS transistor M44 adapted to share a gate thereof with the NMOS transistor M43, and to output, as the current ISRCN, a mirror current having a predetermined magnitude proportional to the current I20.

Operation of the current supply unit having the above described configuration will now be described.

First, the node A is maintained at the level of the reference voltage Vref in accordance with an operation of an operational amplifier, which is coupled to the reference voltage Vref and node A at respective inputs thereof. Accordingly, current I10, which flows from the node A to the ground Vss through a resistor R the node A, has a magnitude of "Vref/R" Switches SW1 to SWN, which are connected to respective PMOS transistors M31, M32 ..., M3N, are controlled by respective digital signals applied thereto, in order to turn on/off respective PMOS transistors M31, M32, ..., M3N. By controlling the number of the switches to be switched on, It is possible to control the magnitude of current flowing through ones of the PMOS transistors M31, M32, ..., M3N turned on in accordance with the switched-on switches. For example, where the number of the switched-on ones of the switches SW1 to SWN is n, the n turned-on ones of the PMOS transistors M31, M32, ..., M3N allow current to flow therethrough. In this case, each turned-on PMOS transistor serves as a current distributor for distributing the current I10, which has a predetermined magnitude. Accordingly, if the PMOS transistors M31, M32, ..., M3N are the same size, then the current supplied to each of the n PMOS transistors has a magnitude of "Vref/nR". Also, the voltage level VRP at the gate of each turned-on PMOS transistor has a value capable of allowing the current having the above magnitude to flow.

In the case of FIG. 4, accordingly, current 20 having a predetermined magnitude corresponding to the voltage VRP flows through the PMOS transistor M41. If the PMOS transistor M41 has the same size as the PMOS transistors M31, M32, ..., M3N, current having a magnitude of "Vref/nR" flows therethrough. Also, a mirror current corresponding to the current flowing through the PMOS transistor M41 flows through the PMOS transistor M42. Accordingly, the current, which has a magnitude proportional to that of the current I20 in the size ratio between the PMOS transistors M41 and M42, is supplied, as the current ISRCP, to the output driver circuit according to the first embodiment of the present invention through the PMOS transistor M42. Here, if the PMOS transistors M31, M32, ..., M3N, M41, and M42 have the same size, the current ISRCP has a magnitude corresponding to "Vref/nR".

In the case of FIG. 4, the current I20 flows through the NMOS transistor M43 when a switch G40 connected between the PMOS transistor M41 and the NMOS transistor M43 is switched on. Also, current having a predetermined magnitude proportional to the current I20 flows through the NMOS transistor M44 sharing the gate thereof with the NMOS transistor M43. Accordingly, this current is supplied to the output driver circuit according to the first embodiment of the present invention. In this case, the magnitude of the current ISRCN is determined in accordance with the size ratio between the NMOS transistors M43 and M44. For example, where the NMOS transistors M43 and M44 have the same size, the current ISRCN has a magnitude corresponding to "Vref/nR".

Figure 6:
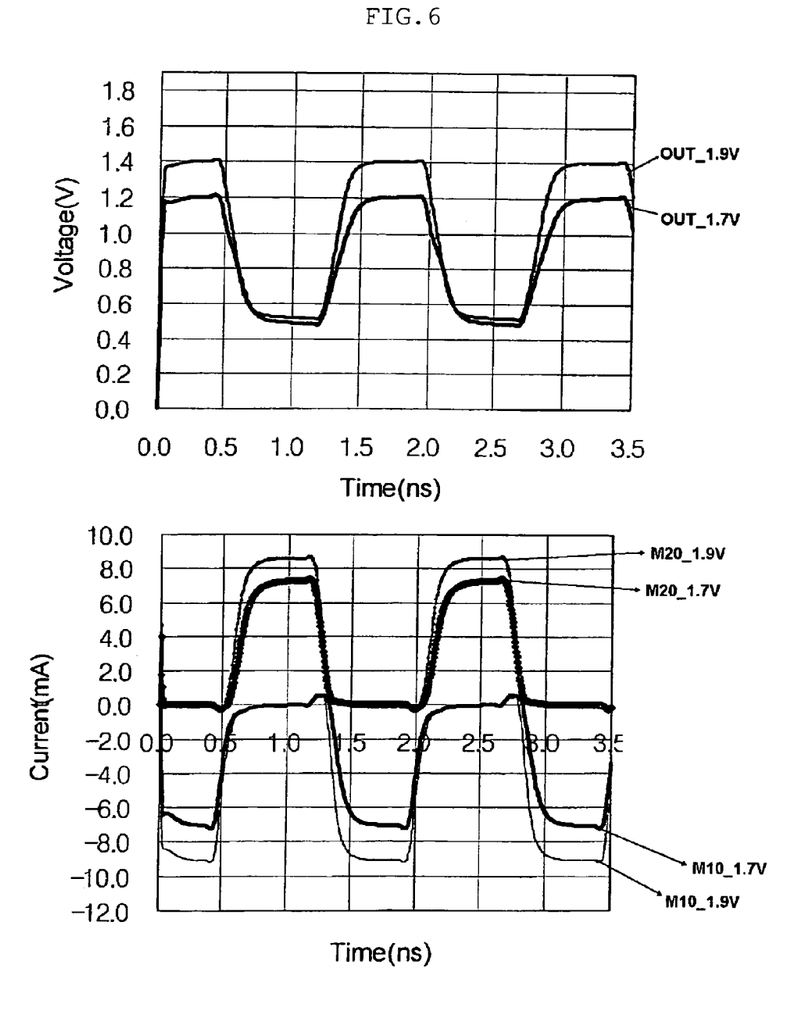
FIG. 6 is a diagram depicting a characteristic waveform of the output driver circuit according to the first embodiment of the present invention.

FIG. 6 illustrates a characteristic waveform of the output driver circuit according to the first embodiment of the present invention. Referring to FIG. 6, it can be seen that the current flowing through the PMOS transistor M10 and NMOS transistor M20 and signals outputted from the PMOS transistor M10 and NMOS transistor M20 are controlled in a linear manner.

Thus, the output driver circuit according to the first embodiment of the present invention can obtain stable slew rate characteristics without any considerable influence by conditions of the semiconductor memory device such as a variation in temperature and high-speed operation, by controlling the slew rate of an output signal thereof in accordance with the current ISRCP and current ISRCN supplied from the current supply unit. The current ISRCP and current ISRCN can be controlled by controlling the number of turned-on ones of the switches SW1 to SWN included in the reference current generating circuit, and thus, controlling the voltage VRP.

Figure 5:
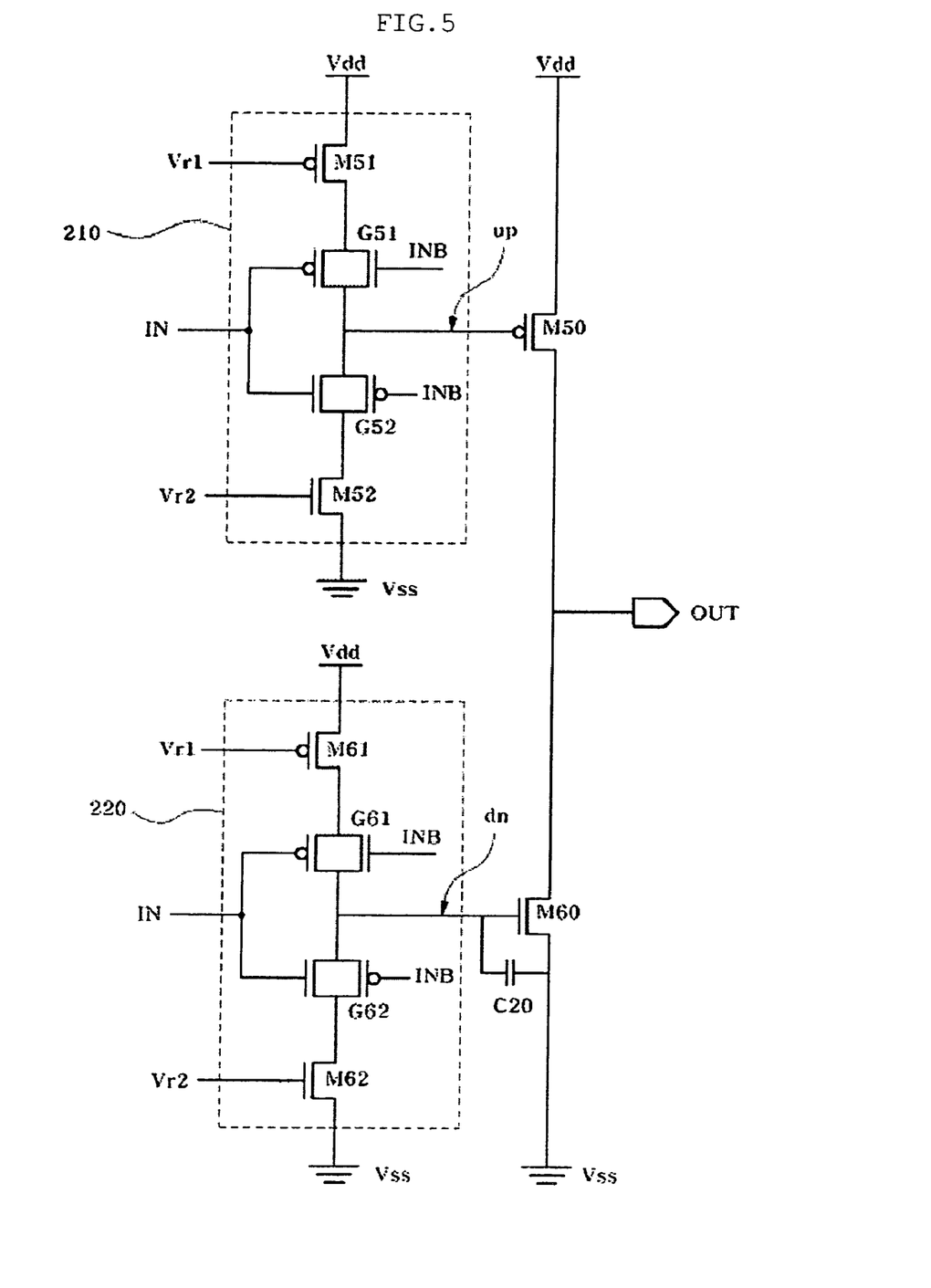
FIG. 5 is a circuit diagram illustrating an output driver circuit according to a second embodiment of the present invention.

FIG. 5 is a circuit diagram illustrating an output driver circuit according to a second embodiment of the present invention. As shown in FIG. 5, the output driver circuit includes a PMOS transistor M50 adapted to output a supply voltage Vdd to an output terminal OUT, and an NMOS transistor M60 adapted to output a ground voltage Vss to the output terminal OUT. The output driver circuit also includes a first pre-driver 210 composed of a PMOS transistor M51 adapted to pull up a gate up of the PMOS transistor M50 to the level of the supply voltage Vdd in response to a predetermined voltage Vr1, and an NMOS transistor M52 adapted to pull down a gate dn of the PMOS transistor M50 to the level of the ground voltage Vss in response to a predetermined voltage Vr2. The output driver circuit further includes a second pre-driver 220 composed of a PMOS transistor M61 adapted to pull up a gate up of the PMOS transistor M60 to the level of the supply voltage Vdd in response to the voltage Vr1, and an NMOS transistor M62 adapted to pull down a gate dn of the NMOS transistor M60 to the level of the ground voltage Vss in response to the voltage Vr2.

Operation of the output driver circuit according to the second embodiment of the present invention will now be described in detail.

In accordance with a transition of an input data signal IN from a low level to a high level, gates G51 and G61 are turned off, whereas gates G52 and G62 are turned on. Accordingly, charges stored in the gate up of the PMOS transistor M50 are discharged through the NMOS transistor M52. As a result, the voltage level at the gate up of the PMOS transistor M50 is transited to the level of the ground voltage Vss, thereby causing the PMOS transistor M50 to turn on. Accordingly, the PMOS transistor M50 outputs, to the output terminal OUT, a signal having a level corresponding to the supply voltage Vdd. Also, charges stored in the gate dn of the NMOS transistor M60 are discharged through the NMOS transistor M62. As a result, the voltage level at the gate dn of the NMOS transistor M60 is transited to the level of the ground voltage Vss, thereby causing the NMOS transistor M60 to turn off. In this case, the magnitude of discharge current flowing through each of the NMOS transistors M52 and M62 is controlled by the voltage Vr2. Also, the discharge time is determined in accordance with the magnitude of the discharge current, the parasitic capacitance generated at the associated gate up or dn, and the charged voltage at the associated gate up or dn. Also, the time taken for the PMOS transistor M50 to turn on or the time taken for the NMOS transistor M60 to turn off is determined in accordance with a variation in potential at the associated gate up or dn depending on the discharge current magnitude.

Thus, the turning-on time of the PMOS transistor M50 and the tuning-off time of the NMOS transistor M60 can be controlled by the voltage Vr2 having a predetermined level. Accordingly, it is possible to stably control a slew rate according to rising of an output voltage, that is, a rising slew rate, determined in accordance with the turning-on time of the PMOS transistor M50 and the turning-off time of the NMOS transistor 60, using the voltage Vr2.

On the other hand, when the input data signal IN is transited from a high level to a low level, the gates G51 and G61 are turned on, whereas the gates G52 and G62 are turned off. Accordingly, the gate up of the PMOS transistor M50 is charged with current supplied from the supply voltage source Vdd through the PMOS transistor M51. As a result, the voltage level at the gate up of the PMOS transistor M50 is transited to the level of the supply voltage Vdd, thereby causing the PMOS transistor M50 to turn off. Also, the gate dn of the NMOS transistor M60 is charged with current supplied from the supply voltage source Vdd through the PMOS transistor M61. As a result, the voltage level at the gate dn of the NMOS transistor M60 is transited to the level of the supply voltage Vdd, thereby causing the NMOS transistor M60 to turn on. Accordingly, the NMOS transistor M60 outputs, to the output terminal OUT, a signal having a level corresponding to the ground voltage Vss. In this case, the magnitude of charge current flowing through each of the PMOS transistors M51 and M61 is controlled by the voltage Vr1. Also, the charge time is determined in accordance with the magnitude of the charge current, and the parasitic capacitance generated at the associated gate up or dn. Also, the time taken for the PMOS transistor M50 to turn off or the time taken for the NMOS transistor M60 to turn on is determined in accordance with a variation in potential at the associated gate up or dn depending on the charge current magnitude.

Thus, the turning-off time of the PMOS transistor M50 and the turning-on time of the NMOS transistor M60 can be controlled by the voltage Vr1 having a predetermined level. Accordingly, it is possible to stably control a slew rate according to falling of an output voltage, that is, a falling slew rate, determined in accordance with the turning-off time of the PMOS transistor M50 and the turning-on time of the NMOS transistor 60, using the voltage Vr1.

Each of the voltages Vr1 and Vr2 may be supplied from a separate voltage source. In particular, for the voltage Vr1 adapted to control the magnitude of charge current, the voltage VRP used in the current supply unit according to the first embodiment of the present invention may be used. For the voltage Vr2 adapted to control the magnitude of discharge current, the voltage VRN generated in the current supply unit may be used.

Meanwhile, the output driver circuit should exhibit the same pull-up and pull-down abilities at the output stage thereof. To this end, the PMOS transistor M50, which is a pull-up driver, should have a size corresponding to about 2 times that of the NMOS transistor M60, which is a pull-down driver. In this case, however, the parasitic capacitance generated at the gate up of the pull-up driver also corresponds to about 2 times the parasitic capacitance generated at the gate dn of the pull-down driver. Such a parasitic capacitance difference may cause different ON/OFF timings. In order to avoid such a phenomenon, the output driver circuit according to the second embodiment of the present invention may further include a compensation capacitor C20 connected between the gate dn of the NMOS transistor M60 and the ground Vss, as shown in FIG. 5.

Thus, the output driver circuit according to the second embodiment of the present invention can effectively control the slew rate of an output signal, using a relatively simple circuit configuration, because the turning-on and turning-off times of the PMOS transistor M50 and NMOS transistor M60 adapted to determine the slew rate of the output signal are controlled, based on the voltages Vr1 and Vr2, each of which has a predetermined level. It is also possible to prevent an increase in the current of the output driver circuit.

As apparent from the above description, the present invention provides an output driver circuit which uses a current or voltage supplied from a current supply unit exhibiting a small output variation, to control a slew rate at an output stage thereof, thereby being capable of preventing an abrupt variation in the slew rate even when a variation in resistance and supply voltage occurs due to a variation in process and temperature conditions. Accordingly, the output driver circuit can be widely used on output stages of high-speed interface circuits.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An output driver circuit comprising:
   a pull-up driver adapted to output a supply voltage to an output terminal;
   a pull-down driver adapted to output a ground voltage to the output terminal;
   a first pull-up pre-driver adapted to be enabled in response to a data input signal, and to pull up, in an enable state thereof, a gate of the pull-up driver to a level of the supply voltage, using a first charge current controlled by a first current supplied from a current supply unit;
   a first pull-down pre-driver adapted to be enabled in response to the data input signal, and to pull down, in an enable state thereof, the gate of the pull-up driver to a level of the ground voltage, using a first discharge current controlled by a second current supplied from the current supply unit;
   a second pull-up pre-driver adapted to be enabled in response to the data input signal, and to pull up, in an enable state thereof, a gate of the pull-down driver to the level of the supply voltage, using a second charge current controlled by the first current; and
   a second pull-down pre-driver adapted to be enabled in response to the data input signal, and to pull down, in an enable state thereof, the gate of the pull-down driver to the level of the ground voltage, using a second discharge current controlled by the second current.

2. The output driver circuit according to claim 1, wherein the first pull-up pre-driver comprises:
   a first transistor adapted to allow the first current to flow between a supply voltage source and the current supply unit; and
   a second transistor adapted to compose a current mirror, together with the first transistor, to pull up the gate of the pull-up driver, using the first charge current, which has a predetermined magnitude proportional to the first current.

3. The output driver circuit according to claim 1, wherein the first pull-down pre-driver comprises:
   a first transistor adapted to allow the second current to flow between the current supply unit and a ground; and
   a second transistor adapted to compose a current mirror, together with the first transistor, to pull down the gate of the pull-up driver, using the first discharge current, which has a predetermined magnitude proportional to the second current.

4. The output driver circuit according to claim 1, wherein:
   the first pull-up pre-driver comprises a first transistor adapted to allow the first current to flow between a supply voltage source and the current supply unit, and a second transistor adapted to compose a current mirror, together with the first transistor, to pull up the gate of the pull-up driver, using the first charge current, which has a predetermined magnitude proportional to the first current; and
   the first pull-down pre-driver comprises a third transistor adapted to allow the second current to flow between the current supply unit and a ground, and a fourth transistor adapted to compose a current mirror, together with the third transistor, to pull down the gate of the pull-up driver, using the first discharge current, which has a predetermined magnitude proportional to the second current.

5. The output driver circuit according to claim 1, wherein the second pull-up pre-driver comprises:
   a first transistor adapted to allow the first current to flow between a supply voltage source and the current supply unit; and
   a second transistor adapted to compose a current mirror, together with the first transistor, to pull up the gate of the pull-down driver, using the second charge current, which has a predetermined magnitude proportional to the first current.

6. The output driver circuit according to claim 1, wherein the second pull-down pre-driver comprises:
   a first transistor adapted to allow the second current to flow between the current supply unit and a ground; and
   a second transistor adapted to compose a current mirror, together with the first transistor, to pull down the gate of the pull-down driver, using the second discharge current, which has a predetermined magnitude proportional to the second current.

7. The output driver circuit according to claim 1, wherein:
   the second pull-up pre-driver comprises a first transistor adapted to allow the first current to flow between a supply voltage source and the current supply unit, and a second transistor adapted to compose a current mirror, together with the first transistor, to pull up the gate of the pull-down driver, using the second charge current, which has a predetermined magnitude proportional to the first current; and
   the second pull-down pre-driver comprises a third transistor adapted to allow the second current to flow between the current supply unit and a ground, and a fourth transistor adapted to compose a current mirror, together with the third transistor, to pull down the gate of the pull-down driver, using the second discharge current, which has a predetermined magnitude proportional to the second current.

8. The output driver circuit according to claim 1, wherein:
the first pull-up pre-driver comprises a first transistor adapted to allow the first current to flow between a supply voltage source and the current supply unit, and a second transistor adapted to compose a current mirror, together with the first transistor, to pull tip the gate of the pull-up driver, using the first charge current, which has a predetermined magnitude proportional to the first current;
the first pull-down pre-driver comprises a third transistor adapted to allow the second current to flow between the current supply unit and a ground, and a fourth transistor adapted to compose a current mirror, together with the third transistor, to pull down the gate of the pull-up driver, using the first discharge current, which has a predetermined magnitude proportional to the second current;
the second pull-up pre-driver comprises a fifth transistor adapted to allow the first current to flow between the supply voltage source and the current supply unit, and a sixth transistor adapted to compose a current mirror, together with the fifth transistor, to pull up the gate of the pull-down driver, using the second charge current, which has a predetermined magnitude proportional to the first current; and
the second pull-down pre-driver comprises a seventh transistor adapted to allow the second current to flow between the current supply unit and the ground, and an eighth transistor adapted to compose a current mirror, together with the seventh transistor, to pull down the gate of the pull-down driver, using the second discharge current, which has a predetermined magnitude proportional to the second current.

9. The output driver circuit according to claim 1, further comprising:
a compensation capacitor connected to the gate of the pull-down driver and the ground, and adapted to compensate for a parasitic capacitance difference between the gate of the pull-up driver and the gate of the pull-down driver.

10. The output driver circuit according to claim 1, wherein the current supply unit comprises:
a plurality of current-dividing transistors adapted to divide, into current of a predetermined magnitude, current flowing between a first node, which is maintained at a level corresponding to a reference voltage, and the ground, and then to supply the divided current to the first node;
a first additional transistor adapted to allow a third current to flow therethrough in a magnitude corresponding to that of the divided current in response to a voltage at respective gates of the current-dividing transistors;
a second additional transistor adapted to compose a current mirror, together with the first additional transistor, to output, as the second current, a current having a predetermined magnitude proportional to the third current;
a third additional transistor adapted to supply the third current from the first additional transistor to the ground; and
a fourth additional transistor adapted to compose a current mirror, together with the third additional transistor, to output, as the first current, a current having a predetermined magnitude proportional to the third current.

11. The output driver circuit according to claim 9, wherein the current supply unit comprises:
a plurality of current-dividing transistors adapted to divide, into current of a predetermined magnitude, current flowing between a first node, which is maintained at a level corresponding to a reference voltage, and the ground, and then to supply the divided current to the first node;
a ninth transistor adapted to allow a third current to flow therethrough in a magnitude corresponding to that of the divided current in response to a voltage at respective gates of the current-dividing transistors;
a tenth transistor adapted to compose a current mirror, together with the ninth transistor, to output, as the second current, a current having a predetermined magnitude proportional to the third current;
an eleventh transistor adapted to supply the third current from the ninth transistor to the ground; and
a twelfth transistor adapted to compose a current mirror, together with the eleventh transistor, to output, as the first current, a current having a predetermined magnitude proportional to the third current.

12. An output driver circuit comprising:
a pull-up driver adapted to output a supply voltage to an output terminal;
a pull-down driver adapted to output a ground voltage to the output terminal;
a first pre-driver including a first pull-up unit adapted to pull up a gate of the pull-up driver to a level of the supply voltage in response to a first voltage having a first predetermined level, a first pull-down unit adapted to pull down the gate of the pull-up driver to a level of the ground voltage in response to a second voltage having a second predetermined level, and the first and second gates adapted to switch respective operations of the first pull-up unit and first pull-down unit in response to a predetermined data input signal;
a second pre-driver including a second pull-up unit adapted to pull up a gate of the pull-down driver to the level of the supply voltage in response to the first voltage, the second pull-down unit adapted to pull down the gate of the pull-down driver to the level of the ground voltage in response to the second voltage, and third and fourth gates adapted to switch respective operations of the second pull-up unit and second pull-down unit in response to a predetermined data input signal; and
a compensation capacitor connected to the gate of the pull-down driver and a ground, and adapted to compensate for a parasitic capacitance difference between the gate of the pull-tip driver and the gate of the pull-down driver.

13. An output driver circuit comprising:
a pull-up driver adapted to output a supply voltage to an output terminal;
a pull-down driver adapted to output a ground voltage to the output terminal;
a first pre-driver including a first pull-up unit adapted to pull up a gate of the pull-up driver to a level of the supply voltage in response to a first voltage having a first predetermined level, and a first pull-down unit adapted to pull down the gate of the pull-up driver to a level of the ground voltage in response to a second voltage having a second predetermined level;
a second pre-driver including a second pull-up unit adapted to pull up a gate of the pull-down driver to the level of the supply voltage in response to the first voltage, and a second pull-down unit adapted to pull down the gate of the pull-down driver to the level of the ground voltage in response to the second voltage; and
a compensation capacitor connected to the gate of the pull-down driver and a ground, and adapted to compensate for a parasitic capacitance difference between the gate of the pull-up driver and the gate of the pull-down driver.

* * * * *

UNITED STATES PATENT AND TRADEMARK OFFICE
CERTIFICATE OF CORRECTION

PATENT NO. : 7,224,194 B2 Page 1 of 1
APPLICATION NO. : 10/982032
DATED : May 29, 2007
INVENTOR(S) : Dong-uk Lee

It is certified that error appears in the above-identified patent and that said Letters Patent is hereby corrected as shown below:

In the Claims:

At Column 16, line 51, "pull-tip" should be -- pull-up --.

Signed and Sealed this

Twentieth Day of November, 2007

JON W. DUDAS
*Director of the United States Patent and Trademark Office*